(12) United States Patent
Miyata et al.

(10) Patent No.: US 9,148,175 B2
(45) Date of Patent: Sep. 29, 2015

(54) ERROR CORRECTION CODING DEVICE, ERROR CORRECTION DECODING DEVICE AND METHOD THEREFOR

(75) Inventors: Yoshikuni Miyata, Tokyo (JP); Wataru Matsumoto, Tokyo (JP); Hideo Yoshida, Tokyo (JP); Kazuo Kubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 98 days.

(21) Appl. No.: 13/982,919

(22) PCT Filed: May 30, 2012

(86) PCT No.: PCT/JP2012/003554
§ 371 (c)(1),
(2), (4) Date: Jul. 31, 2013

(87) PCT Pub. No.: WO2012/164929
PCT Pub. Date: Dec. 6, 2012

(65) Prior Publication Data
US 2013/0311847 A1 Nov. 21, 2013

(30) Foreign Application Priority Data

May 31, 2011 (JP) .................. 2011-122237

(51) Int. Cl.
*H03M 13/00* (2006.01)
*H03M 13/29* (2006.01)
(Continued)

(52) U.S. Cl.
CPC .......... *H03M 13/29* (2013.01); *H03M 13/1102* (2013.01); *H03M 13/1145* (2013.01); *H03M 13/2909* (2013.01); *H03M 13/356* (2013.01); *H03M 13/152* (2013.01)

(58) Field of Classification Search
CPC .. H04B 7/0456; H04B 7/0871; H04B 7/0697; H03M 13/1145; H03M 13/356; H03M 13/29; H03M 13/2909; H03M 13/1102; H03M 13/152; H03M 13/451; H03M 13/116; H03M 13/118; H03M 13/1185; H03M 13/6527; H03M 13/6544; G06F 11/1072; H04L 1/0057
See application file for complete search history.

(56) References Cited

U.S. PATENT DOCUMENTS

| 5,623,504 A | 4/1997 | Tolhuizen |
| 7,071,851 B1 * | 7/2006 | Blaum et al. .................... 341/59 |

(Continued)

FOREIGN PATENT DOCUMENTS

| JP | 2001 28549 | 1/2001 |
| JP | 2010 258937 | 11/2010 |

OTHER PUBLICATIONS

Sugihara, Kenya et al., "Coding Rate Adjustment for LDPC Codes by Row-Splitting", The Institute of Electronics, Infromation and Communication Engineers Sogo Taikai Koen Ronbunshu, p. 123, (Mar. 2, 2010).

(Continued)

*Primary Examiner* — Guerrier Merant
(74) *Attorney, Agent, or Firm* — Oblon, McClelland, Maier & Neustadt, L.L.P.

(57) ABSTRACT

Provided is an error correction encoder that performs coding on both a transmission area and a redundancy area of the transmission frame by using a product code, and when excess or deficiency is arisen with respect to allocation of an information sequence area and/or a parity sequence area in a product code frame generated by the coding using the product code, non-uniformly allocate the information sequence area to the parity sequence area, and/or non-uniformly allocate the parity sequence area to the information sequence area, where each of the non-uniform allocations is performed in accordance with the arisen excess or deficiency.

12 Claims, 11 Drawing Sheets

(51) Int. Cl.
*H03M 13/11* (2006.01)
*H03M 13/35* (2006.01)
*H03M 13/15* (2006.01)

(56) References Cited

U.S. PATENT DOCUMENTS

| | | | |
|---|---|---|---|
| 7,296,212 | B1 | 11/2007 | Hammons, Jr. |
| 2003/0126548 | A1 | 7/2003 | Chapalain et al. |
| 2003/0171121 | A1* | 9/2003 | Kim et al. .................... 455/451 |
| 2006/0031734 | A1* | 2/2006 | Stolpman .................... 714/752 |
| 2007/0043997 | A1* | 2/2007 | Yang et al. .................... 714/758 |
| 2007/0186140 | A1* | 8/2007 | Senda .................... 714/758 |
| 2008/0016433 | A1* | 1/2008 | Stolpman .................... 714/786 |
| 2008/0109699 | A1* | 5/2008 | Stolpman .................... 714/758 |
| 2009/0265600 | A1* | 10/2009 | Matsumoto et al. .......... 714/752 |
| 2009/0276687 | A1* | 11/2009 | Kim et al. .................... 714/777 |
| 2010/0275104 | A1 | 10/2010 | Kubo et al. |
| 2011/0083052 | A1* | 4/2011 | Lau et al. .................... 714/752 |
| 2012/0066563 | A1* | 3/2012 | Obata et al. .................. 714/752 |

OTHER PUBLICATIONS

Imai, "Coding Theory", Institute of Electronics, Inoframtion and Communication Engineers , pp. 228-231, (1990).
Recommendation ITU-T. G.709/1331, "Interfaces for the Optical Transport Network (OTN)", Total pp. (216), (Dec. 2009).
Hirasawa, S. et al., "Modified Product Code", IEEE Transactions on Information Theory, vol. IT-30, No. 2, pp. 299-306, (Mar. 1984).
International Search Report Issued Jul. 31, 2012 in PCT/JP12/003554 Filed May 30, 2012.
Supplementary Partial European Search Report issued Dec. 22, 2014 in Patent Application No. 12792209.4.

* cited by examiner

ERROR CORRECTION CODING DEVICE, ERROR CORRECTION DECODING DEVICE AND METHOD THEREFOR

TECHNICAL FIELD

The present invention relates to an error correction coding device, an error correction decoding device, and a method therefor in a digital transmission system and the like.

BACKGROUND ART

A conventional product code is composed of one type of code in a longitudinal direction and another type of code in a lateral direction (for example, refer to Non-Patent Literature 1 presented in below and FIG. 14 of the present application). This frame configuration is defined as a product code frame. With regard to the product code, although any of coding in the longitudinal direction and the coding in the lateral direction may be performed first, an element code in the lateral direction and the element code in the longitudinal direction are conveniently defined as an outer code C1 (coded first) and an inner code C2 (subsequently coded), respectively. An arrow 901 depicted in FIG. 14 indicates a coding direction of the outer code C1 (from left to right on the paper). In the arrow 901, a section 901a indicates an allocation of an information sequence, and a section 901b indicates an allocation of a parity sequence. A coding to separate an information sequence area 911 and a parity sequence area 912 from each other after the coding is referred to as a systematic coding.

Similarly, an arrow 902 indicates a coding direction of the inner code C2 (from top to bottom on the paper) in which the information sequence and the parity sequence are allocated to a section 902a and a section 902b, respectively. Also in this case, a systematic coding in which the information sequence area 911 and a parity sequence area 913 are separated from each other is employed. Meanwhile, in a case of the product code, a Check-on-Check area 914 to be allocated to the parity sequences 901b and 902b of both of the outer code C1 and the inner code C2 may be provided.

CITATION LIST

Non-Patent Literature 1
Imai, "Coding Theory", Institute of Electronics, Information and Communication Engineers, pp. 228-230, 1990

SUMMARY OF INVENTION

Conventional error correction coding device, error correction decoding device, and method therefor are configured as described above. Following those conventional structures, there is limitation of a code length of an entire product code, that is to say, the limitation that each area of the product code frame should be configured to be a rectangle. Therefore, it is not possible to allocate the information sequence area and the parity sequence area without excess or deficiency to an OTUk frame (Optical channel Transport Unit-k (where "k" is classified as k=1, 2, 3, 4 according to a transmission speed)) compliant with the following Reference Literature 1 being a standard transmission frame in core system optical transmission and the like illustrated in FIG. 15. Accordingly, there is a problem that excess or deficiency may be arisen in sizes of the information sequence area and the parity sequence area. That is to say, there is a problem that a waste of transmission throughput may occur and error correction capability may be deteriorated. Meanwhile, the transmission frame illustrated in FIG. 15 is described in detail later.

Reference Literature 1
ITU-T Recommendation G. 709

The present invention is made for solving the above-described problem and an object thereof is to obtain the error correction coding device, the error correction decoding device, and the method therefor for inhibiting a waste of the transmission throughput.

The error correction coding device according to the present invention includes an error correction encoder that performs coding on both a transmission area and a redundancy area of the transmission frame by using a product code, the error correction encoder being configured to: when excess or deficiency is arisen with respect to allocation of an information sequence area and/or a parity sequence area in a product code frame generated by the coding using the product code, non-uniformly allocate the information sequence area to the parity sequence area, and/or non-uniformly allocate the parity sequence area to the information sequence area, where each of the non-uniform allocations is performed in accordance with the arisen excess or deficiency.

According to the present invention, it is possible to inhibit the waste of the transmission throughput and improve error correction processing capability.

DESCRIPTION OF EMBODIMENTS

In order to explain the present invention in more detail, modes for carrying out the present invention are hereinafter described with referring to the attached drawings.

Embodiment 1

Figure 1:
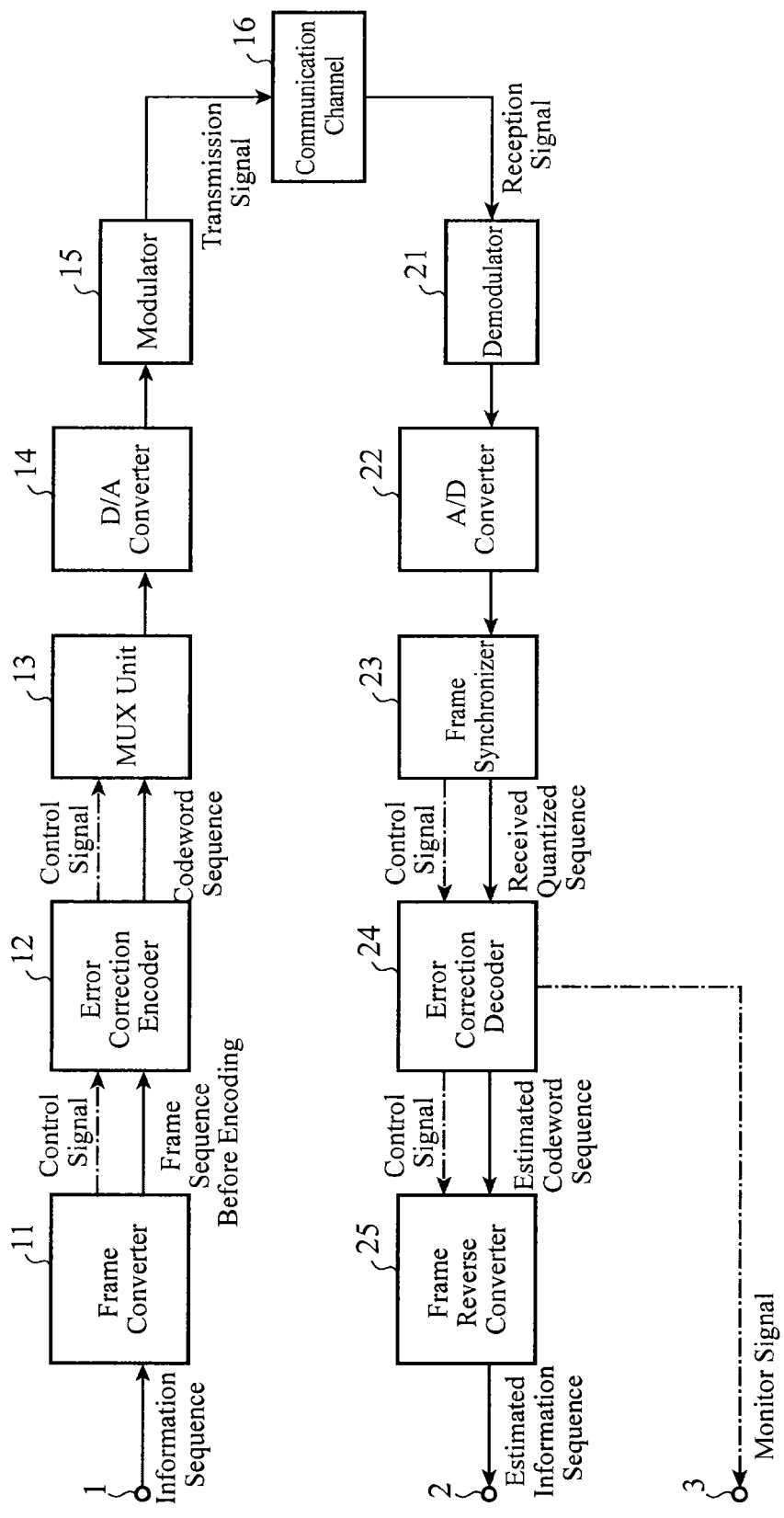
FIG. 1 is a block diagram illustrating a configuration of a digital transmission system according to Embodiment 1.

FIG. 1 is a block diagram illustrating a configuration of a digital transmission system according to Embodiment 1 of the present invention.

The transmission system of the Embodiment 1 includes a frame converter 11 connected to an information source 1, an error correction encoder 12 (an error correction coding device) connected to the frame converter 11, a MUX (a multiplexer for multiplexing) unit 13 connected to the error correction encoder 12, an D/A (digital/analog) converter 14 connected to the MUX unit 13, a modulator 15 connected to the D/A converter 14, a communication channel 16 connected to the modulator 15, a demodulator 21 connected to the modulator 15 through the communication channel 16, an A/D (analog/digital) converter 22 connected to the demodulator 21, a frame synchronizer 23 connected to the A/D converter 22, an error correction decoder 24 (an error correction decoding device) connected to the frame synchronizer 23, and a frame reverse converter 25 connected to the error correction decoder 24. The error correction decoder 24 and the frame reverse converter 25 are connected to a communication controller 3 and a receiver 2, respectively. Each of the frame converter 11, the MUX unit 13, the D/A converter 14, the modulator 15, the communication channel 16, the demodulator 21, the A/D converter 22, the frame synchronizer 23, and the frame reverse converter 25 has a device configuration commonly used in the transmission system. Although the D/A converter 14 is required in a case of performing a multi-level modulation, which is binary modulation or higher-level modulation, this is not necessarily required in a case of the binary modulation.

Figure 2:
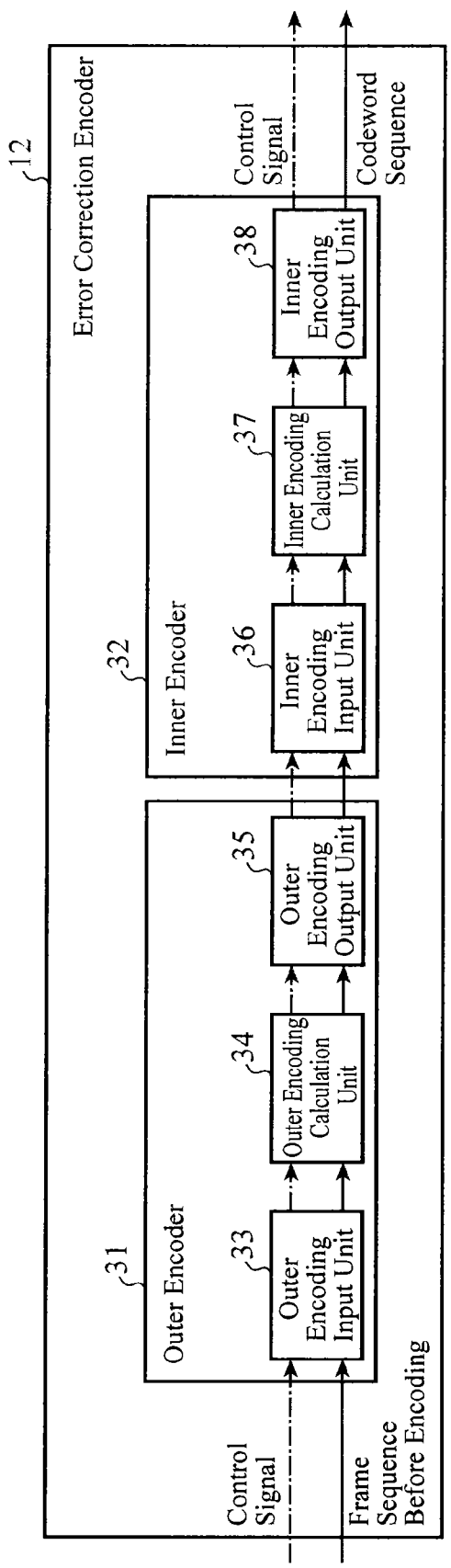
FIG. 2 is a block diagram illustrating a configuration of an error correction encoder of the digital transmission system according to Embodiment 1.

FIG. 2 is a block diagram illustrating a configuration of the error correction encoder of the digital transmission system according to the Embodiment 1 of the present invention.

The error correction encoder 12 includes an outer encoder (an encoder for an outer code) 31 and an inner encoder (an encoder for an inner code) 32. The outer encoder 31 includes an outer coding input unit 33, an outer coding calculation unit 34, and an outer coding output unit 35. The inner encoder 32 includes an inner coding input unit 36, an inner coding calculation unit 37, and an inner coding output unit 38.

The outer encoder 31 and the inner encoder 32 are not illustrated in detail. However, various specific configurations of each unit are supposed as long as a function to non-uniformly allocate an information sequence area and a parity sequence area in accordance with excess or deficiency when the excess or the deficiency is arisen in allocation of the information sequence area and the parity sequence area in a product code frame to a transmission area and a redundancy area in a transmission frame, which is a characteristic function of the present invention, is performed in the input unit and the output unit in each of the outer encoder 31 and the inner encoder 32.

Operation of the error correction encoder 12 is described. Control signals are input to the outer coding input unit 33 of the outer encoder 31 in predetermined serial or parallel order or in accordance with a predetermined interface standard such as SFI (Serdes Framer Interface). Those control signals are utilized for identifying a header, a format or the like of an uncoded frame sequence and frames thereof, where the uncoded frame has been obtained by performing a DEMUX (Demultiplex) and a frame format conversion on information sequence from the information source 1 by the frame converter 11.

With regard to a control area, a transmission area and a redundancy area of a frame, predetermined lengths are defined to those areas in, for example, an OTUk frame compliant with ITU-T Recommendation G.709, which is generally used in optical communications. The detail description thereof will be given later.

The frame converter 11 is required when a frame format of the above-described OTUk frame or an optional OTUkV frame thereof is taken into consideration. However, the frame converter 11 is not necessarily required in the digital transmission system capable of continuously coding in which it is not required to be conscious of the frame format. The frame format converted by the frame converter 11 may be used in various types such as a frame for subscriber cable communication, mobile wireless communication, satellite communication, and a digital recording device, and a packet for various types of wireless communication in addition to the OTUk frame for the optical communication. However, if it is considered to non-uniformly allocate the information sequence area and the parity sequence area in accordance with excess or deficiency when the excess or the deficiency is arisen in the allocation of the information sequence area and the parity sequence area in the product code frame to the transmission area and the redundancy area in the transmission frame, a configuration in which the frame format having a predetermined fixed length is used such as the OTUk frame is most preferable.

The outer encoder 31 performs a coding process of the outer code (hereinafter, referred to as an outer coding process). Specifically, the outer coding input unit 33 performs input timing adjustment, a descrambling process, an input data conversion process (including zero insertion to the parity sequence area), input sequence order adjustment (including an interleaving process) and the like with respect to the frame sequence before coding. Those processes are performed by using the frame sequence before coding and the control signal used for identifying the head, the format and the like of the sequence input from the frame converter 11. When an output from the frame converter 11 is output after conversion into a predetermined interface standard such as the SFI, a reverse conversion thereof is also performed.

The outer coding calculation unit 34 performs an outer coding calculation. Although various modes are considered as a flow of a process of the outer coding calculation according to input timing, input sequence order, and the number of parallel inputs from the outer coding input unit 33. For example, there are a method of processing n2 outer codewords in parallel, a method of executing a pipeline process for n1-bit (or symbol) parallel input data bus of only n2 stages and the like.

Meanwhile, a hard decision decoding is suitable as the method of the outer coding calculation performed by the outer coding calculation unit 34, and a block code capable of making a circuit scale relatively smaller, especially a BCH (Bose-Chaudhuri-Hocquenghem) code, an RS (Reed-Solomon) code and the like are suitable. It is also possible to use an LDPC (Low-Density Parity-Check) code and the like for soft decision decoding having error correction capability higher than that of a single piece of block code for the hard decision decoding.

The outer coding output unit 35 performs an output timing adjustment, an output sequence order adjustment (including the interleaving process or an orthogonal conversion process), a scrambling process and the like. Then the outer coding output unit 35 outputs a result as an outer coding output sequence and outputs a control signal used for identifying a head, a format and the like of the sequence.

The timing adjustment, the sequence order adjustment and the like implemented by the outer coding input unit 33 and the outer coding output unit 35 differ depending on a format of an adopted outer code, presence or absence of the interleaving and its configuration, presence or absence of the scrambling and its format and the like. However, various configurations can be employed as long as having a function which is the characteristic function of the present invention, that is, the function to rearrange taking into consideration of the non-uniform allocation of the information sequence area and the parity sequence area according to the excess or the deficiency when excess or deficiency is arisen in the allocation of the information sequence area and the parity sequence area in the product code frame to the transmission area and the redundancy area in the transmission frame. Although the output from the outer coding output unit 35 has a format of n2 parallel normal bus signals, it is also possible to output the signal after conversion into a predetermined interface standard such as the SFI. This configuration is capable of embedding the outer encoder 31 and the inner encoder 32 in different devices. The sequence order adjustment is described in detail later.

The inner encoder 32 performs a coding process of the inner code (hereinafter, referred to as an inner coding process). Specifically, the inner coding input unit 36 performs the input timing adjustment, the descrambling process, the input data conversion process (including the zero insertion to the parity sequence area), the input sequence order adjustment (including the interleaving process or the orthogonal conversion process) and the like with respect to the outer coding output sequence. Those processes are performed by using the outer coding output sequence and the control signal used for identifying the head, the format and the like of the sequence input from the outer encoder 31. When the output from the outer encoder 31 is output after the conversion into a predetermined interface standard such as the SFI, the reverse conversion thereof is also performed.

The inner coding calculation unit 37 performs an inner coding calculation. Various modes are considered as a flow of a process of the inner coding calculation according to the input timing, the input sequence order, and the number of parallel inputs from the inner coding input unit 36. For example, there are a method of processing n1 inner codewords in parallel, a method of executing the pipeline process for n2-bit (or symbol) parallel input data bus of only n1 stages and the like.

Meanwhile, a hard decision decoding is suitable as the method of the inner coding calculation performed by the inner coding calculation unit 37, and the block code capable of making the circuit scale relatively smaller, especially the BCH code, the RS code and the like are suitable. It is also possible to use the LDPC code and the like for the soft decision decoding having the error correction capability higher than that of the single piece of block code for the hard decision decoding.

The inner coding output unit 38 performs the output timing adjustment, the output sequence order adjustment (including a de-interleaving process), the scrambling process and the like, outputs a result as a codeword sequence and outputs a control signal used for identifying a head, a format and the like of the sequence.

The timing adjustment, the sequence order adjustment and the like implemented by the inner coding input unit 36 and the inner coding output unit 38 differ depending on a format of the adopted inner code, the presence or absence of the interleaving and its configuration, the presence or absence of the scrambling and its format and the like. However, various configurations can be employed as long as having a function which is the characteristic function of the present invention, that is, the function to rearrange taking into consideration of the non-uniform allocation of the information sequence area and the parity sequence area according to excess or deficiency when excess or deficiency is arisen in the allocation of the information sequence area and the parity sequence area in the product code frame to the transmission area and the redundancy area in the transmission frame. Although the output from the inner coding output unit 38 has the format of n2 parallel normal bus signals, it is also possible to output the signal after the conversion into a predetermined interface standard such as the SFI. The sequence order adjustment is described in detail later.

The codeword sequence and the control signal output from the inner coding output unit 38 are transmitted to the MUX unit 13 as a coding result of the error correction encoder 12. The codeword sequence is subjected to multiplexing, signal processing, a D/A conversion process, a modulation process and the like by the MUX unit 13, the D/A converter 14, and the modulator 15 and transmitted to the communication channel 16 as a transmission signal.

Meanwhile, it may be configured such that data transmitted among the outer coding input unit 33, the outer coding calculation unit 34, and the outer coding output unit 35, the data transmitted among the inner coding input unit 36, the inner coding calculation unit 37, and the inner coding output unit 38, and the data transmitted between the outer encoder 31 and the inner encoder 32 are passed by a pipeline system through a bus, which connects the circuits, or passed through a working storage area, which is provided to be referred to by preceding and subsequent adjacent circuits. It is also possible to configure such that a specific section, such as the outer encoder 31 and the inner encoder 32 are connected in accordance with a predetermined interface standard such as the SFI, for example.

In the above mentioned configuration, the error correction encoder 12 includes the outer coding input unit 33, the outer coding calculation unit 34, the outer coding output unit 35, the inner coding input unit 36, the inner coding calculation unit 37, and the inner coding output unit 38 as different element blocks. However, it is not necessarily required to implement the components as such different element blocks as long as having the function which is the characteristic function of the present invention, that is, the function to non-uniformly allocate the information sequence area and the parity sequence area according to the excess or the deficiency when excess or deficiency is arisen in the allocation of the information sequence area and the parity sequence area in the product code frame to the transmission area and the redundancy area in the transmission frame.

For example, a part of the calculation process of the outer coding calculation unit 34 may be performed in a part of the input sequence order adjustment in the outer coding input unit 33. Also, a part of the calculation process of the outer coding calculation unit 34 may be performed in a part of the output sequence order adjustment in the outer coding output unit 35.

Further, a part of the calculation process of the inner coding calculation unit 37 may be performed in a part of the input sequence order adjustment in the inner coding input unit 36. Further, a part of the calculation process of the inner coding calculation unit 37 may be performed in a part of the output sequence order adjustment in the inner coding output unit 38. Further, it is also possible to integrate a part of the output sequence order adjustment in the outer coding output unit 35 and a part of the input sequence order adjustment in the inner coding input unit 36 and simultaneously execute them, thereby configuring them as one element block.

Figure 3:
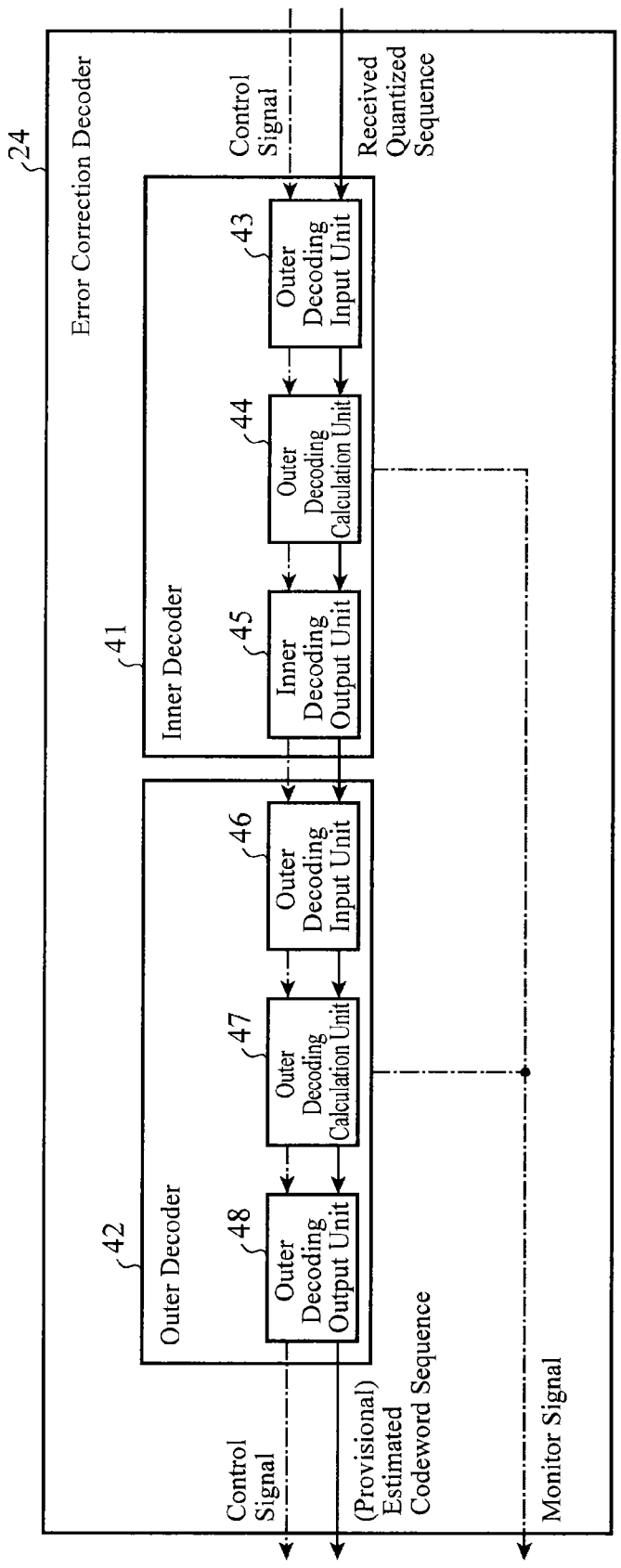
FIG. 3 is a block diagram illustrating a configuration of an error correction decoder of the digital transmission system according to Embodiment 1.

A configuration and operation of the error correction decoder 24 are described. FIG. 3 is a block diagram illustrating the configuration of the error correction decoder of the digital transmission system according to the Embodiment 1 of the present invention.

The error correction decoder 24 includes an inner decoder 41 (i.e. a decoder for inner codes) and an outer decoder 42 (i.e. a decoder for outer codes). The inner decoder 41 includes an inner decoding input unit 43, an inner decoding calculation unit 44, and an inner decoding output unit 45. The outer decoder 42 includes an outer decoding input unit 46, an outer decoding calculation unit 47, and an outer decoding output unit 48.

Although the inner decoder 41 and the outer decoder 42 are not illustrated in detail, various specific configurations of each unit can be employed in the input unit and the output unit included in each unit as long as having a function which is the characteristic function of the present invention, that is, the function to non-uniformly allocate the information sequence area and the parity sequence area according to excess or deficiency when the excess or the deficiency is arisen in the allocation of the information sequence area and the parity sequence area in the product code frame to the transmission area and the redundancy area in the transmission frame.

The operation of the error correction decoder 24 is described. The error correction decoder 24 has the configuration corresponding to the error correction encoder 12, and also has a function to decode an error correction code coded by the error correction encoder 12.

In FIG. 3, a control signal is input to the inner decoding input unit 43 of the inner decoder 41 in predetermined serial or parallel order or in accordance with a predetermined interface standard such as the SFI. The control signal is used for identifying a received quantized sequence and a head, a format and the like of the transmission frame included in the received quantized sequence. The received quantized sequence has been subject to a demodulation process, an A/D conversion process, the signal processing, the demultiplexing and the like by the demodulator 21, the A/D converter 22, and the frame synchronizer 23 based on a reception signal from the communication channel 16.

When the frame format of the above-described OTUk frame, OTUkV frame and the like is taken into consideration, the frame synchronizer 23 is used as a circuit required for detecting OH (OverHead: a data sequence for control included in the control area) added to the received quantized sequence to specify a head position of the frame. However, the frame synchronizer 23 is not necessarily required in the digital transmission system capable of continuously coding in which it is not required to be conscious of the frame format.

The frame format subjected to a synchronization process by the frame synchronizer 23 may be used in various types such as the frame for the subscriber cable communication, the mobile wireless communication, the satellite communication, and the digital recording device, and the packet for various types of wireless communication in addition to the OTUk frame for the optical communication. However, if it is considered to non-uniformly allocate the information sequence area and the parity sequence area according to the excess or the deficiency when the excess or the deficiency is arisen in the allocation of the information sequence area and the parity sequence area in the product code frame to the transmission area and the redundancy area in the transmission frame, the configuration in which the frame format having a predetermined fixed length is used such as the OTUk frame is most preferable.

Note that, when the received quantized sequence is quantized into q bits per one transmission symbol, a case of q=1 is referred to as "hard decision" and a case of q>1 is referred to as "soft decision". It is hereinafter described supposing the hard decision. However, a case of the soft decision may also be similarly configured and a sequence conversion process similar to that in a case of the hard decision may be performed by regarding the q bits per one transmission symbol as one symbol and processing the symbol in a batch.

In the case of the hard decision (q=1) of the received quantized sequence also, when each element of the codeword is processed in a symbol unit such as in the RS code and a multilevel LDPC code, for example, it is possible to perform the sequence conversion process similar to that in the normal hard decision by regarding s transmission symbols as one codeword symbol and processing the codeword symbol in a batch. This configuration is similar in the error correction encoder 12.

The inner decoder 41 performs a decoding process of inner codes (hereinafter, referred to as an inner decoding process). Specifically, the inner decoding input unit 43 performs the input timing adjustment, the descrambling process, the input data conversion process (including soft input value calculation and the like in the soft decision decoding), the input sequence order adjustment (including the interleaving process) and the like with respect to the received quantized sequence based on the received quantized sequence and the control signal used for identifying the head, the format and the like of the received quantized sequence input from the frame synchronizer 23. When an output from the frame synchronizer 23 is output after the conversion into a predetermined interface standard such as the SFI, the reverse conversion thereof is also performed.

The inner decoding calculation unit 44 performs an inner decoding calculation (i.e. decoding of the inner code). Although various modes are considered as a flow of a process of the inner decoding calculation according to the input timing, the input sequence order, the number of parallel inputs and the like from the inner decoding input unit 43, there are a method of processing the received quantized sequences corresponding to the n1 inner codewords in parallel, a method of executing the pipeline process for the n2-bit (or symbol) parallel input data bus of only the n1 stages and the like, for example.

The process of the inner decoding is performed according to the method of the inner coding. It is preferable to perform hard decision bounded-distance decoding (also including missing correction decoding) when the block code such as the BCH code and the RS code is selected and perform soft decision iterative decoding when the LDPC code and the like is used. Especially, in this Embodiment 1, it is described supposing that the hard decision bounded-distance decoding for the BCH code is used.

The inner decoding output unit 45 performs the output timing adjustment, the output sequence order adjustment (including the interleaving process or the orthogonal conversion process), the scrambling process and the like and outputs a result as an inner decoding output sequence and outputs a control signal used for identifying a head, a format and the like of the sequence.

Although the timing adjustment, the sequence order adjustment and the like by the inner decoding input unit 43 and the inner decoding output unit 45 differ according to a format of an adopted inner code, the presence or absence of the interleaving and its configuration, the presence or absence of the scrambling and its format and the like, whatever the configuration is, the implementation may be made with the various configurations as long as the configuration corresponds to the inner encoder 32 and has the function to rearrange taking into consideration of the non-uniform allocation of the information sequence area and the parity sequence area according to the excess or the deficiency when the excess or the deficiency is arisen in the allocation of the information sequence area and the parity sequence area in the product code frame to the transmission area and the redundancy area in the transmission frame, which is the characteristic function of the present invention. Although the output from the inner decoding output unit 45 has the format of the n2 parallel normal bus signal, it is also possible to output the signal after the conversion into a predetermined interface standard such as the SFI, for example. In this case, it becomes possible to embed the inner decoder 41 and the outer decoder 42 in different devices. The sequence order adjustment is described in detail later.

The outer decoder 42 performs an outer decoding process (i.e. decoding of the outer code). Specifically, the outer decoding input unit 46 performs the input timing adjustment, the descrambling process, the input data conversion process (including the soft input value calculation and the like in the soft decision decoding), the input sequence order adjustment (including the interleaving process or the orthogonal conversion process) and the like with respect to the inner decoding output sequence based on the inner decoding output sequence and the control signal used for identifying the head, the format and the like of the sequence input from the inner decoder 41. When the output from the outer decoder 42 is output after the conversion into a predetermined interface standard such as the SFI, the reverse conversion thereof is also performed.

The outer decoding calculation unit 47 performs outer decoding calculation. Although various modes are considered as a flow of a process of the outer decoding calculation according to the input timing, the input sequence order, and the number of parallel inputs from the outer decoding input unit 46, there are a method of processing the inner decoding output sequences corresponding to the n2 outer codewords in parallel, a method of executing the pipeline process for the n1-bit (or symbol) parallel input data bus of only the n2 stages and the like, for example.

The process of the outer decoding calculation is performed according to the method of the outer coding. It is preferable to perform the hard decision bounded-distance decoding (also including the missing correction decoding) when the block code such as the BCH code and the RS code is selected and perform the soft decision iterative decoding when the LDPC code and the like is used. In the Embodiment 1, it is described supposing that the hard decision bounded-distance decoding for the BCH code is used.

The outer decoding output unit 48 performs the output timing adjustment, the output sequence order adjustment (including the de-interleaving process or the orthogonal conversion process), the scrambling process and the like and outputs a result as a (provisional) estimated codeword sequence and outputs a control signal used for identifying a head, a format and the like of the sequence.

Although the timing adjustment, the sequence order adjustment and the like by the outer decoding input unit 46 and the outer decoding output unit 48 differ according to the format of the adopted outer code, the presence or absence of the interleaving and its configuration, the presence or absence of the scrambling and its format and the like, whatever the configuration or the format is, the implementation may be made with the various configurations as long as the configuration may support the outer encoder 31 and has the function to rearrange taking into consideration of the non-uniform allocation of the information sequence area and the parity sequence area according to the excess or the deficiency when the excess or the deficiency is arisen in the allocation of the information sequence area and the parity sequence area in the product code frame to the transmission area and the redundancy area in the transmission frame, which is the characteristic function of the present invention. Although the output from the outer decoding output unit 48 has the format of the n2 parallel normal bus signal, it is also possible to output the signal after the conversion into a predetermined interface standard such as the SFI, for example. Meanwhile, the sequence order adjustment is described in detail later.

The (provisional) estimated codeword sequence and the control signal output from the outer decoding output unit 48 are transmitted to the frame reverse converter 25 as a decoding result of the error correction encoder 12, that is to say, an estimated codeword sequence and the control signal. The frame reverse converter 25 performs predetermined frame format conversion and multiplexing process and outputs a generated estimated information sequence to the receiver 2.

The inner decoder 41 and the outer decoder 42 output monitor signals indicating the decoding results of the inner decoding and the outer decoding. As a format of the monitor signal, there are the total number of bits inverted at the time of error correction, the total number of symbols of which error value is changed at the time of the error correction, the total number of element codewords of which error is detected (i.e. determined that the error remains because the correction is not possible) and the like, for example. A format of the output may be appropriately configured such as the decoding result only of the inner decoder 41, the decoding result only of the outer decoder 42, a sum of the decoding results of the inner decoder 41 and the outer decoder 42. The monitor signals of the inner decoder 41 and the outer decoder 42 are transmitted to the communication controller 3.

It may be configured such that the data transmitted among the inner decoding input unit 43, the inner decoding calculation unit 44, and the inner decoding output unit 45, data transmitted among the outer decoding input unit 46, the outer decoding calculation unit 47, and the outer decoding output unit 48, and data transmitted between the inner decoder 41 and the outer decoder 42 are passed by the pipeline system through the bus, which connects the circuits. Alternatively, this may be configured to be passed through the working storage area, which is provided so as to be referred to by the preceding and subsequent adjacent circuits. It is also possible to configure such that a specific section, such as the inner decoder 41 and the outer decoder 42 are connected to each other in accordance with a predetermined interface standard such as the SFI, for example.

Although a configuration in which the error correction decoder 24 includes the inner decoding input unit 43, the inner decoding calculation unit 44, the inner decoding output unit 45, the outer decoding input unit 46, the outer decoding calculation unit 47, and the outer decoding output unit 48 as different element blocks is described above, it is not necessarily required to implement the components as different element blocks as long as the configuration corresponds to the error correction encoder 12 and has the function to non-uniformly allocate the information sequence area and the parity sequence area according to the excess or the deficiency when the excess or deficiency is arisen in the allocation of the information sequence area and the parity sequence area in the product code frame to the transmission area and the redundancy area in the transmission frame, which is the characteristic function of the present invention.

For example, a part of the calculation process of the inner decoding calculation unit 44 may be performed in a part of the input sequence order adjustment in the inner decoding input unit 43. Also, a part of the calculation process of the inner decoding calculation unit 44 may be performed in a part of the output sequence order adjustment in the inner decoding output unit 45. Further, a part of the calculation process of the outer decoding calculation unit 47 may be performed in a part of the input sequence order adjustment in the outer decoding input unit 46. Further, a part of the calculation process of the outer decoding calculation unit 47 may be performed in a part of the output sequence order adjustment in the outer decoding output unit 48. Further, it is also possible to integrate a part of the output sequence order adjustment in the inner decoding output unit 45 and a part of the input sequence order adjustment in the outer decoding input unit 46 and simultaneously execute them, thereby configuring them as one element block.

Figure 4:
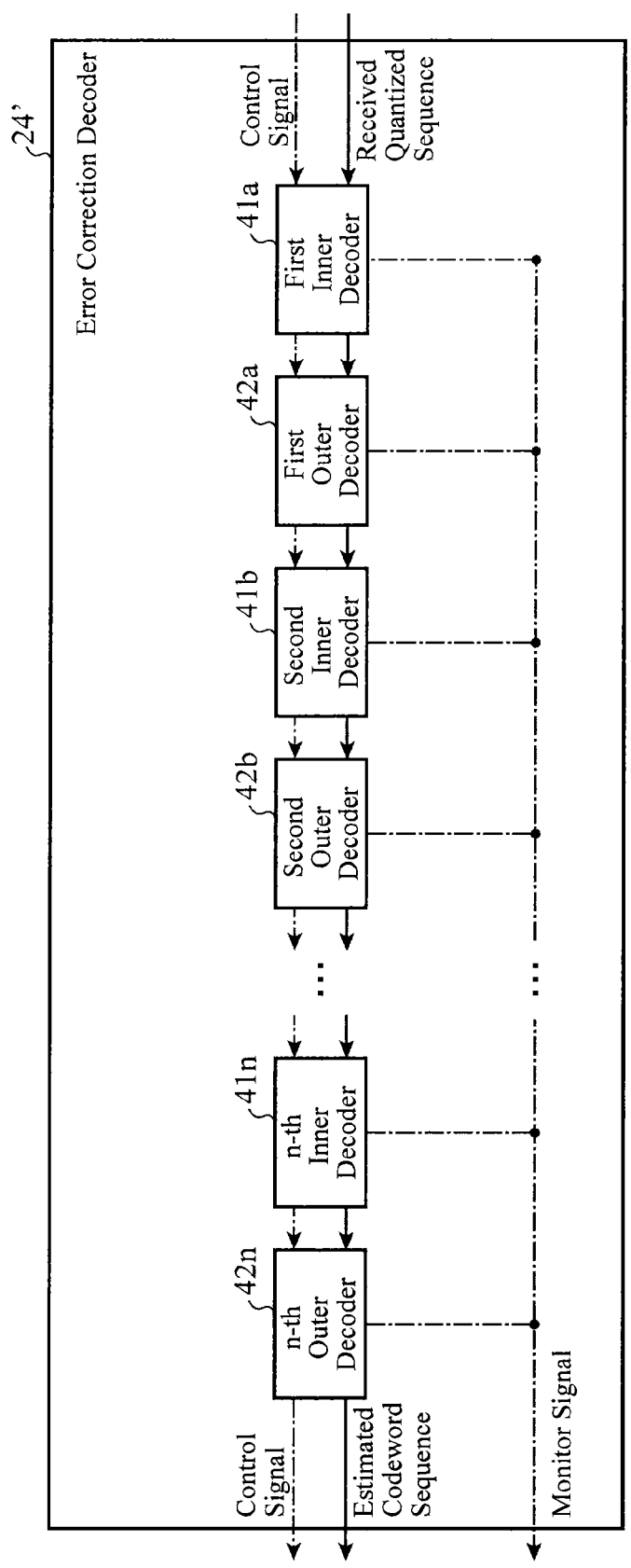
FIG. 4 is a block diagram illustrating another configuration of the error correction decoder of the digital transmission system according to the Embodiment 1.

A different configuration of the error correction decoder 24 is described. FIG. 4 is a block diagram illustrating the different configuration example of the error correction decoder of the digital transmission system according to the Embodiment 1 of the present invention.

As illustrated in FIG. 4, an error correction decoder 24' is obtained by cascade connection of a predetermined number of iterations of the inner decoders 41 and the outer decoders 42 such as a first inner decoder 41a, a first outer decoder 42a, a second inner decoder 41b, a second outer decoder 42b, . . . , an n-th inner decoder 41n, and an n-th outer decoder 42n. The error correction decoder 24' has the configuration corresponding to the error correction encoder 12 and has a function to iteratively decode the error correction code coded by the error correction encoder 12.

In FIG. 4, the received quantized sequence subjected to the demodulation process, the A/D conversion process, the signal processing, the demultiplexing and the like by the demodulator 21, the A/D converter 22, and the frame synchronizer 23 based on the reception signal from the communication channel 16 and the control signal used for indentifying the head, the format and the like of the transmission frame included in the received quantized sequence are input to an inner decoding input unit 43a of the inner decoder 41a in predetermined serial or parallel order or in accordance with a predetermined interface standard such as the SFI.

The inner decoder 41a performs the inner decoding process of a first iteration, outputs a processing result as the inner decoding output sequence and outputs the control signal, which is referred to when the head and the format of the sequence are identified. The outer decoder 42a performs the outer decoding process of the first iteration, outputs the processing result as the (provisional) estimated codeword sequence and outputs the control signal, which is referred to when the head, the format and the like of the sequence are identified. Meanwhile, the process identical to the above-described process is performed as the inner decoding process and the outer decoding process.

The inner decoder 41b performs the inner decoding process of a second iteration, outputs the processing result as the inner decoding output sequence and output the control signal, which is referred to when the head and the format of the sequence are identified. The outer decoder 42b performs the outer decoding process of the second iteration, outputs the processing result as the (provisional) estimated codeword sequence and outputs the control signal, which is referred to when the head, the format and the like of the sequence are identified. Meanwhile, the process identical to the above-described process is performed as the inner decoding process and the outer decoding process. In this manner, the decoding process by the inner decoder 41 and the outer decoder 42 are iteratively performed a predetermined number (=n) of times.

Finally, the (provisional) estimated codeword sequence and the control signal output from an outer decoding output unit (not illustrated) of the outer decoder 42n, which performs a last iteration, are output to the frame reverse converter 25 as the decoding result (the estimated codeword sequence and the control signal) of the error correction decoder 24'. The frame reverse converter 25 outputs the estimated information sequence subjected to predetermined frame format conversion and multiplexing to the receiver 2.

The inner decoder 41 and the outer decoder 42 output the monitor signals indicating the decoding results of the inner decoding and the outer decoding. As the format of the monitor signal, there are the total number of bits inverted at the time of the error correction, the total number of symbols of which error value is changed at the time of the error correction, the total number of element codewords of which error is detected (determined that the error remains because the correction is not possible) and the like, for example. The format of the output may be appropriately configured such as the decoding result only of the inner decoder 41a of the first iteration, the decoding result only of the outer decoder 42n of n-th iteration, a sum of the inner decoder 41 and the outer decoder 42 for each iteration and the like. The monitor signals of the inner decoder 41 and the outer decoder 42 are transmitted to the communication controller 3.

Although an example of the cascade connection of the inner decoders 41 and the outer decoders 42 according to the number of iterations is described as the error correction decoder 24' illustrated in FIG. 4, it is also possible to configure to hold only one group or several (not more than the number of iterations) groups of the inner decoder 41 and the outer decoder 42, allow them to operate at twice or several times the speed of an input/output frequency of the error correction decoder 24, and feed back to input the output from the outer decoder 42 to the inner decoder 41 again.

Next, the input/output sequence order adjustment, especially the interleaving process and the deinterleaving process executed by the error correction encoder 12 and the error correction decoder 24 are described in detail.

Figure 15:
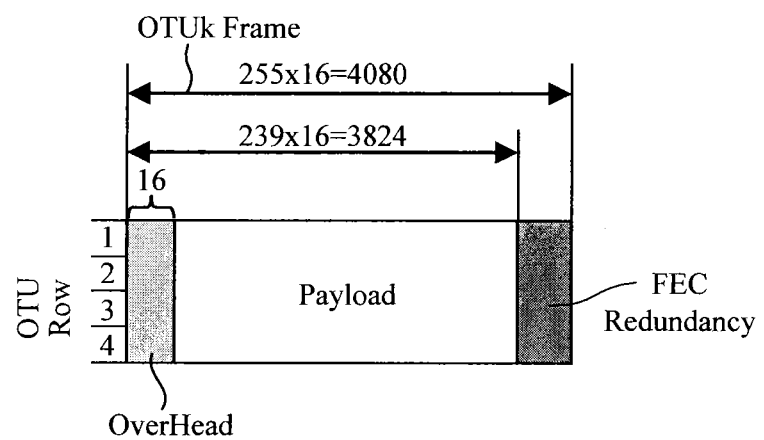
FIG. 15 is an illustrative diagram illustrating the standard frame format in the error correction coding method.

FIG. 15 is an illustrative diagram illustrating a standard transmission frame in core system optical transmission and the OTUk frame complying with cited literature 1 described above.

In FIG. 15, top 16 bytes (1 byte is regarded to be 8 bits) of an OTU Row1, subsequent 238×16 bytes, and subsequent 16×16 bytes are allocated as the OH (OverHead), a Payload, and an FEC (Forward Error Correction) Redundancy, respectively, to be transmitted from left to right on the paper. Similarly, OTU Row 2 to OTU Row4 are transmitted. Herein, the OH is referred to as the control area, the OH and the Payload are integrally referred to as the transmission area, and the FEC Redundancy is referred to as the redundancy area. For the OTUk frame, the error correction encoder 12 and the error correction decoder 24 handle the transmission area as the information sequence area and handle the redundancy area as the parity sequence area.

Figure 14:
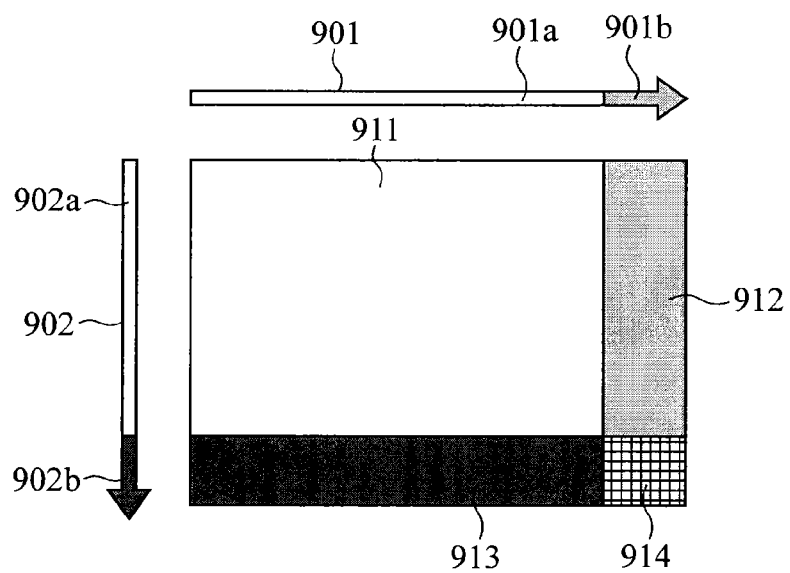
FIG. 14 is an illustrative diagram illustrating a standard frame format in an error correction coding method.

As described above with reference to FIG. 14, in the product code frame based on a conventional product code, it is required to ensure rectangular information sequence area and parity sequence area. By this limitation, it is not possible to allocate the transmission area and the redundancy area of the OTUk frame to the information sequence area and the parity sequence area in the product code frame without the excess or the deficiency.

Figure 5:
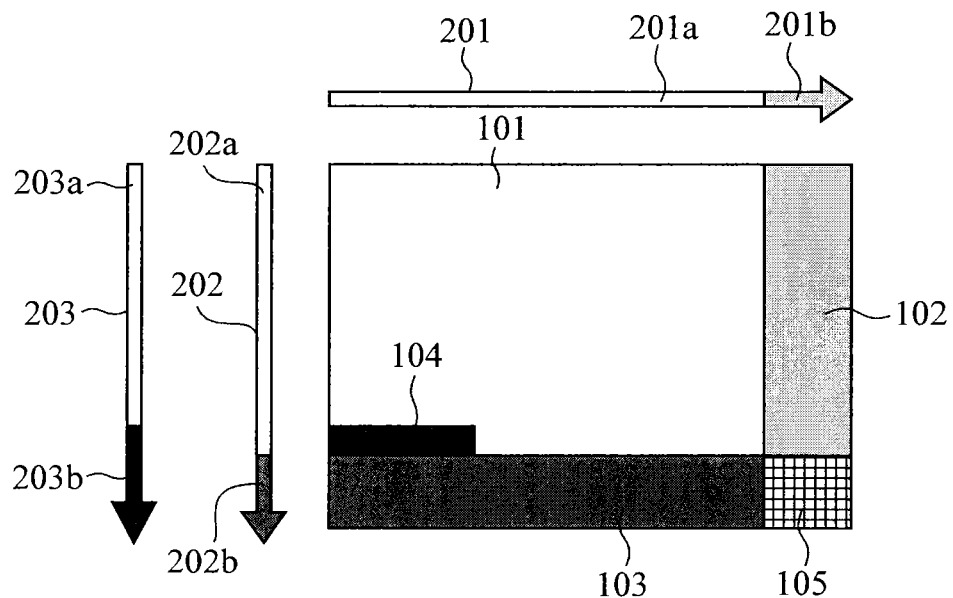
FIG. 5 is an illustrative diagram illustrating a frame format of an error correction coding method according to Embodiment 1.

On the other hand, FIG. 5 is an illustrative diagram illustrating the frame format of the product code frame of the digital transmission system according to the Embodiment 1 of the present invention.

The frame format illustrated in FIG. 5 includes a first information sequence area 101 of the product code frame, an outer code parity sequence area 102 of the product code frame, a first inner code parity sequence area 103 of the product code frame, a second inner code parity sequence area 104 of the product code frame, and a Check-on-Check area (i.e an area allocated to the parity sequences of both of the outer code and the inner code) 105.

An arrow 201 indicates a coding direction of the outer code and its allocation in which an arrow 201a indicates an area to which the information sequence is allocated and an arrow 201b indicates an area to which the parity sequence is allocated. An arrow 202 indicates the coding direction of a first inner code and its allocation in which an arrow 202a indicates an area to which the information sequence is allocated and an arrow 202b indicates an area to which the parity sequence is allocated. An arrow 203 indicates the coding direction of a second inner code and its allocation in which an arrow 203a indicates an area to which the information sequence is allocated and an arrow 203b indicates an area to which the parity sequence is allocated.

Figure 6:
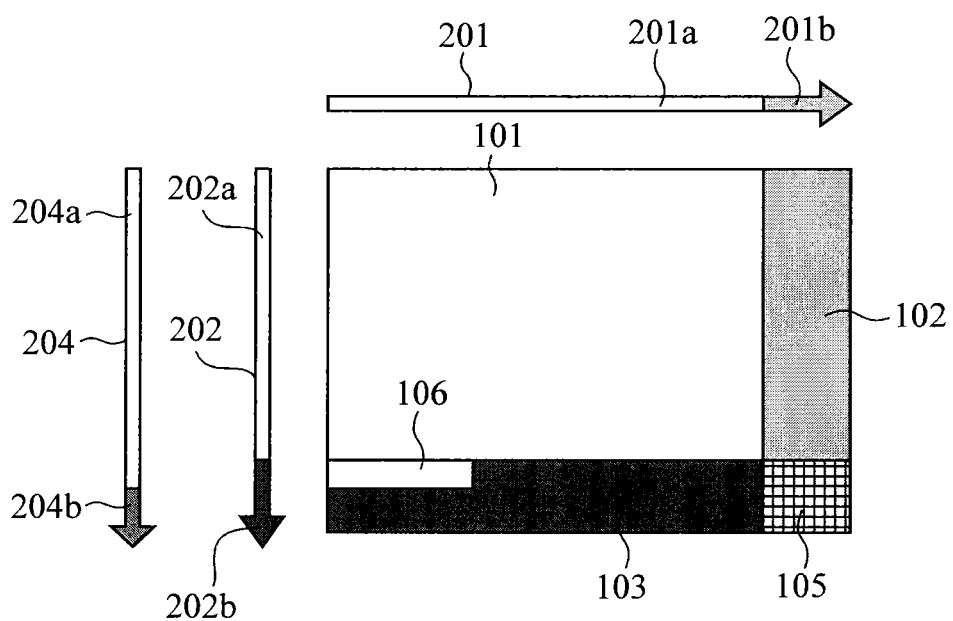
FIG. 6 is an illustrative diagram illustrating the frame format of the error correction coding method according to Embodiment 1.

FIG. 6 is an illustrative diagram illustrating a different frame format of the product code frame of the digital transmission system according to the Embodiment 1 of the present invention.

The frame format illustrated in FIG. 6 illustrates a second information sequence area 106 of the product code frame in place of the second inner code parity sequence area 104 of the product code frame. Further, this has an arrow 204 indicating the coding direction of a zeroth inner code and its allocation in place of the arrow 203 in which 204a and 204b respectively indicate an area to which the information sequence is allocated and an area to which the parity sequence is allocated. The configuration other than this is identical to that in FIG. 5.

In an example of the product code frame illustrated in FIG. 5, a case in which the parity sequence area of the product code frame is small for the redundancy area of the transmission frame in a process in which the non-uniform allocation of the information sequence area and the parity sequence area according to the excess or the deficiency is performed when the excess or the deficiency is arisen in the allocation of the information sequence area and the parity sequence area in the product code frame to the transmission area and the redundancy area in the transmission frame is especially illustrated.

On the other hand, in an example of the product code frame illustrated in FIG. 6, a case in which the parity sequence area of the product code frame is large for the redundancy area of the transmission frame in the process in which the non-uniform allocation of the information sequence area and the parity sequence area according to the excess or the deficiency is performed when the excess or the deficiency is arisen in the allocation of the information sequence area and the parity sequence area in the product code frame to the transmission area and the redundancy area in the transmission frame is especially illustrated.

Herein, the coding method of the error correction encoder 12 is described with reference to FIGS. 5 and 6. Although any of the coding in a longitudinal direction and the coding in a lateral direction may be performed first in a case of the product code, hereinafter, an element code in the lateral direction and an element code in the longitudinal direction are defined as an outer code C1 (coded first) and an inner code C2 (subsequently coded), respectively, for convenience of description. Also, a code length and an information length of the outer code C1 are defined as "n1" and "k1", respectively, to be hereinafter denoted as "(n1, k1)". Meanwhile, n1 corresponds to the number of columns of the product code frame. Also, the code length and the information length of a first inner code C21 are defined as "n21" and "k21", respectively, to be hereinafter denoted as "(n21, k21)". Similarly, the code length and the information length of a second inner code C22 and of a zeroth inner code C20 are defined as "(n22, k22)" and "(n20, k20)", respectively. Meanwhile, n2 corresponds to the number of rows of the product code frame and it is defined as "n2=n21=n22=n20".

In FIG. 5, the arrow 201 indicates the coding direction of the outer code C1 (from left to right on the paper) in which the arrow 201a indicates the area to which the information sequence is allocated and the arrow 201b indicates the area to which the parity sequence is allocated. The coding result has a configuration of a systematic code in which the first information area 101 and the outer code parity sequence area 102 are separated from each other. The outer code C1 is coded by the method of processing in parallel corresponding to the n2 outer codewords or by executing the pipeline process for the n1-bit (or symbol) parallel input data bus of only the n2 stages, for example. The coding result of the outer code has the similar configuration also in the case of the product code frame in FIG. 6.

In FIG. 5, the arrows 202 and 203 indicate the coding direction of the first inner code C21 and the second inner code C22 (from top to bottom on the paper) in which the arrows 202a and 203a indicate the areas to which the information sequence is allocated and the arrows 202b and 203b indicate the areas to which the parity sequence is allocated. The coding result has the configuration of the systematic code in which the first information area 101 and the first inner code parity sequence area 103 or the second inner code parity sequence area 104 are separated from each other. Meanwhile, in the coding of the inner code, the Check-on-Check area 105 is generated by regarding the outer code parity sequence area 102 as the information sequence and coding it by the first inner code. The coding of n11 first inner codes C21 and n12 (corresponding to the number of columns of the second inner code parity sequence area 104) second inner codes C22 is performed by a method or processing in parallel corresponding to the n11 first inner codewords and the n12 second inner codewords or by executing the pipeline process for the n2-bit (or symbol) parallel input data bus of only n1 stages (=n11+n12), for example.

In the coding of the inner code in FIG. 6, as indicated by the arrows 202 and 204, the coding is performed by the n11 first inner codes C21 and n10 zeroth inner codes C20. In a case of the zeroth inner code C20, the first information sequence area 101 and the second information sequence area 106 are regarded as the information sequence and the parity sequence of the coding result is allocated to the first inner code parity sequence area 103. Other than this, the coding method is similar to that in FIG. 5 in detail.

A possible problem in the product code frame in FIGS. 5 and 6 is whether the Check-on-Check area 105, which is a condition as the product code, is generated. In other words, the possible problem is whether the parity sequence area included in the Check-on-Check area 105 is the parity sequence of both of the outer code C1 and the first inner code C21.

In FIG. 5, in order to satisfy the condition, the second inner code C22 is configured as a subcode of the first inner code C21. This is represented as "C21 ⊃ C22". Also in FIG. 6, in order to satisfy the condition, the first inner code C21 is configured as the subcode of the zeroth inner code C20. This is represented as "C20 ⊃ C21".

In this manner, it is possible to configure the product code frame of the digital transmission system of the Embodiment 1 as the product code by configuring each inner code as the subcode. According to this, when the excess or the deficiency is arisen in the allocation of the information sequence area and the parity sequence area in the product code frame to the transmission area and the redundancy area in the transmission frame, the non-uniform allocation of the information sequence area and the parity sequence area according to the excess or the deficiency becomes possible. Further, error correction coding of all codeword bits (or symbols) is performed by both of the outer code and the inner code since the Check-on-Check area 105, which is a characteristic of the product code, is provided. Therefore, the error correction capability may be improved.

Figure 7:
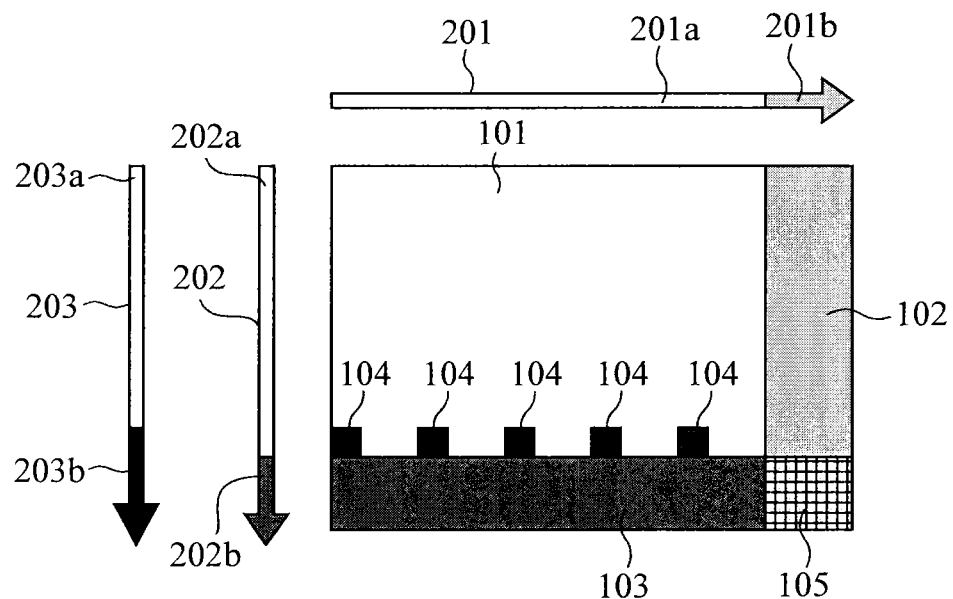
FIG. 7 is an illustrative diagram illustrating the frame format of the error correction coding method according to Embodiment 1.
Figure 8:
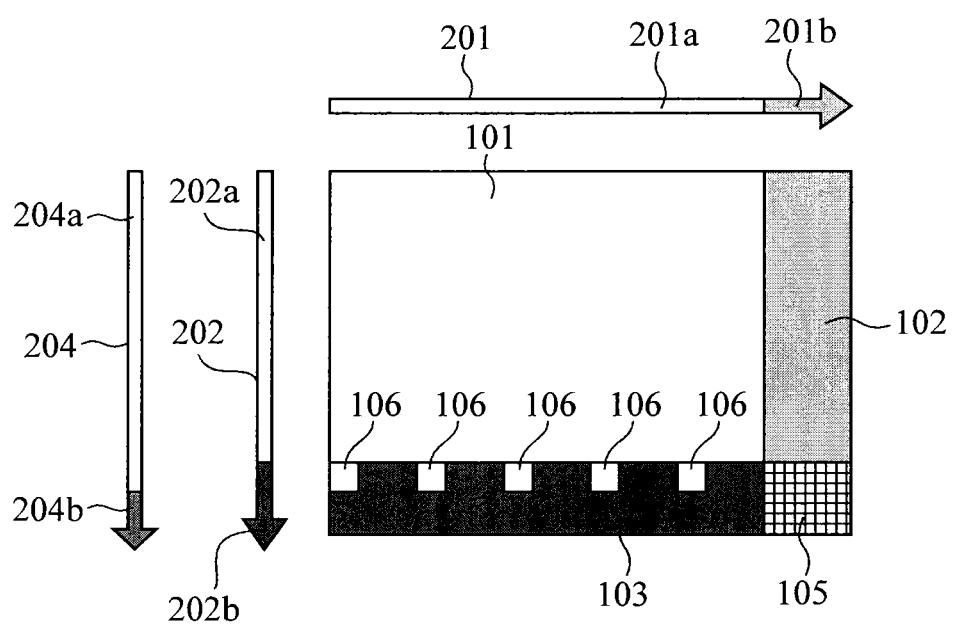
FIG. 8 is an illustrative diagram illustrating the frame format of the error correction coding method according to Embodiment 1.

Another frame format of the product code frame of the digital transmission system of the Embodiment 1 is illustrated in FIGS. 7 and 8.

The frame format illustrated in FIG. 7 illustrates a case in which the second inner code parity sequence area 104 is divided into a plurality of areas. The coding method and the condition are similar to those of the example illustrated in FIG. 5. Also, the total number of columns of a plurality of second inner code parity sequence areas 104 is n12 and this is regarded to be the same as that in the example illustrated in FIG. 5.

The frame format illustrated in FIG. 8 illustrates a case in which the second information sequence area 106 is divided into a plurality of areas. The coding method and the condition are similar to those of the example illustrated in FIG. 6. Also, the total number of columns of a plurality of second information sequence areas 106 is n10 and this is regarded to be the same as that in the example illustrated in FIG. 6.

In FIGS. 7 and 8, positions of the second inner code parity sequence area 104 or the second information sequence area 106 are non-uniformly dispersed in the product code frame. By dispersing in this manner, it is possible to prevent remaining errors from being gathered in a specific site. Therefore, it is possible to improve error resilience against a burst error and the like, for example.

An example including a specific numerical value of the product code frame of the digital transmission system of the Embodiment 1 is described.

An OTU4 frame is adopted as the transmission frame and 16 OTU4 frames are allocated to one product code frame. On the other hand, assume that there are the following codes as the element codes of the product code frame.

Outer code C1: BCH (1632, 1588) code
First inner code C21: BCH (1280, 1236) code
Second inner code C22: BCH (1280, 1225) code A primitive polynomial p(x) over GF (211) of the outer code C1, the first inner code C21, and the second inner code C22 is defined as represented by a following equation (1):

$$p(x)=x11+x2+1 \tag{1}$$

When a primitive element in GF (211), which is a root of p(x), is set to α, a minimal polynomial mi(x) of αi over GF(211) is represented by following equations (2) to (6):

$$m1(x)=p(x) \tag{2}$$

$$m3(x)=x11+x8+x5+x2+1 \tag{3}$$

$$m5(x)=x11+x7+x3+x2+1 \tag{4}$$

$$m7(x)=x11+x5+x3+x2+1 \tag{5}$$

$$m9(x)=x11+x10+x3+x2+1 \tag{6}$$

At that time, a generating polynomial g1 (x) of the outer code C1 and the first inner code C21 is defined as represented by a following equation (7):

$$g1(x)=m1(x)*m3(x)*m5(x)*m7(x) \tag{7}$$

A generating polynomial g2(x) of the second inner code C22 is defined as represented by a following equation (8):

$$g2(x)=m1(x)*m3(x)*m5(x)*m7(x)*m9(x) \tag{8}$$

It is easily understood that the first inner code C21 and the second inner code C22 satisfy a condition of the subcode of C21 ⊃ C22 as described above.

The total number n12 of columns of the second inner code parity sequence area 104 is set to 443.

The allocation of the areas in the transmission frame and the product code frame is as follows:

Transmission Frame:
Transmission area: 1957888(=16*239*8*4*16)
Redundancy area: 131072(=16*16*8*4*16)
Product Code Frame:
Information sequence area: 1957895(=1236*1588-11*443) (including FEC Stuff=7)
Parity sequence area: 131065(=11*4*1280+11*4*1588+11*443) (including Zero Padding=7)

For fine adjustment, a bit defined to be all zero in advance, for example, is added to the information sequence area as the FEC stuff at the time of conversion from the transmission frame into the product code frame. Similarly, for the fine adjustment, the bit defined to be all zero in advance, for example, is added to the redundancy area as the zero padding at the time of the conversion from the product code frame into the transmission frame.

The Embodiment 1 is not limited to parameters described in the above-described specific examples. For example, although an example in which the BCH code is used as the outer code and the inner code is described in the above-described example, the RS code the LDPC code, and the like may also be used in place of this. Further, the method of the error correction coding, a length of the frame format, the number of parallel inputs/outputs, a transmission speed and the like may be appropriately combined as long as the combination is feasible to realize the configuration of the above-described Embodiment 1.

Also, the configuration of the Embodiment 1 is not limited to application to the optical transmission system and this may also be applied to various types of the transmission system such as the subscriber cable communication, the mobile wireless communication, the satellite communication, and the digital recording device. This is similar in following second to Embodiment 4s.

As described above, according to the Embodiment 1 of the present invention, it is configured to perform the non-uniform allocation of the information sequence area and the parity sequence area according to the excess or the deficiency when the excess or the deficiency is arisen in the allocation of the information sequence area and the parity sequence area in the product code frame to the transmission area and the redundancy area in the transmission frame, so that it is possible to inhibit a waste of transmission throughput and improve the error correction capability.

Meanwhile, although a case in which the coding process of the inner code in the longitudinal direction is performed after the coding process of the outer code in the lateral direction is performed by the error correction encoder 12 is described as an example in the above-described Embodiment 1, it is not limited to this case and it is also possible to configure such that the coding process of the outer code in the lateral direction is performed after the coding process of the inner code in the longitudinal direction is performed. Further, although a case in which the decoding process of the outer code in the lateral direction is performed after the decoding process of the inner code in the longitudinal direction is performed by the error correction decoder 24 is described as an example, it is not limited to this case and it is also possible to configure such that the decoding process of the inner code in the longitudinal direction is performed after the decoding process of the outer code in the lateral direction is performed. Further, although a case in which the non-uniform allocation of the information sequence area and the parity sequence area is performed for the inner code in the longitudinal direction is described as an example, it is not limited to this case and it is also possible to perform the non-uniform allocation of the information sequence area and the parity sequence area for the outer code in the lateral direction.

Embodiment 2

Figure 9:
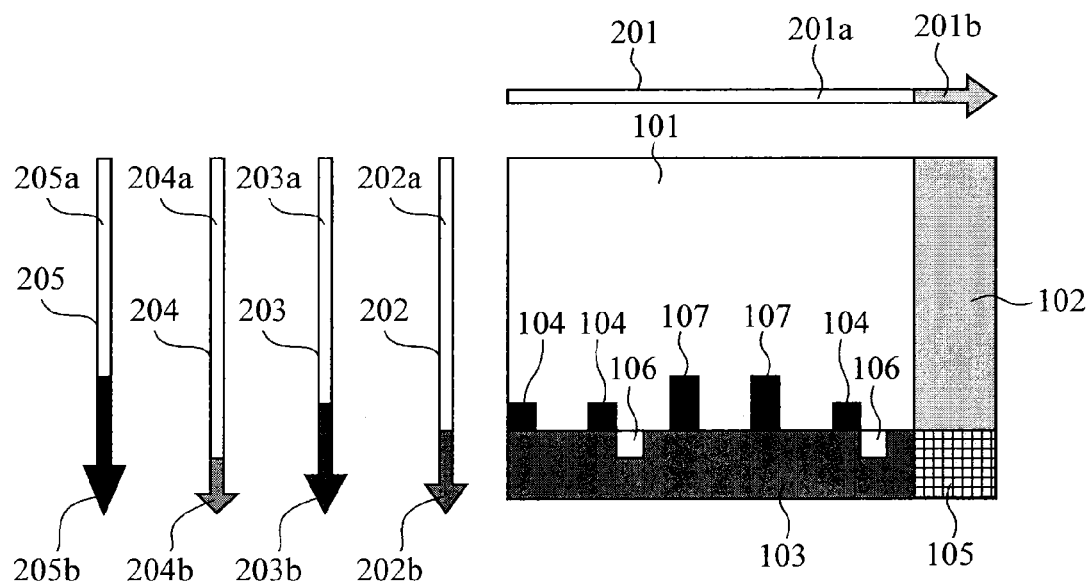
FIG. 9 is an illustrative diagram illustrating a frame format of an error correction coding method according to Embodiment 2.

FIG. 9 is an illustrative diagram illustrating a frame format of a product code of a digital transmission system according to Embodiment 2 of the present invention. In FIG. 9, an arrow 205 indicates a coding direction of a third inner code and its allocation in which an arrow 205a indicates an area to which an information sequence is allocated and an arrow 205b indicates an area to which a parity sequence is allocated. Also, a coding result is such that third inner code parity sequence areas 107 of a product code frame are provided in a dispersed manner. A configuration other than this is similar to that in the above-described Embodiment 1.

In an example in FIG. 9, there are four types of coding of inner code. This is especially different from the above-described Embodiment 1 in that correction capability of a third inner code C23 is improved by using the third inner code parity sequence area 107, and on the other hand, an information sequence, which is deficient therefor, is compensated by using also a second information sequence area 106 to adjust such that sizes of an information sequence area and a parity sequence area in an entire product code frame are the same as those of the Embodiment 1. The third inner code C23 is configured as a subcode of a second inner code C22, a first inner code C21, and a zeroth inner code C20. That is to say, C20 ⊃ C21 ⊃ C22 ⊃ C23 is satisfied.

As described above, according to the Embodiment 2, it is configured to improve the correction capability of the third inner code C23 by using the third inner code parity sequence area 107, so that, in iterative decoding, a correction result of the inner code C23 of which correction capability is high is transmitted to another, a convergence speed of the iterative decoding is improved, and the correction capability of an entire product code may be improved.

Embodiment 3

Figure 10:
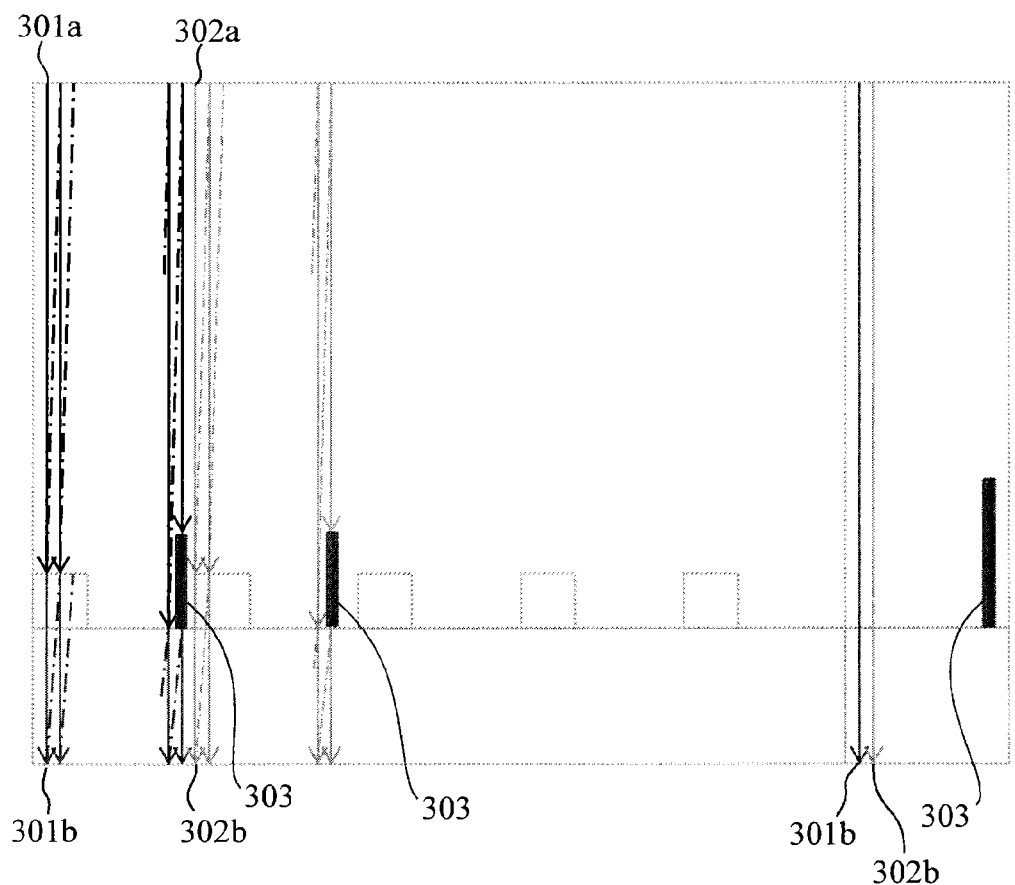
FIG. 10 is an illustrative diagram illustrating a frame format of an error correction coding method according to Embodiment 3.

FIG. 10 is an illustrative diagram illustrating a frame format of a product code of a digital transmission system according to Embodiment 3 of the present invention. In FIG. 10, thick arrows 301a and 301b are the arrows indicating sequence order of a top OTUk frame included in a product code frame and thin arrows 302a and 302b are the arrows indicating the sequence order of a second OTUk frame included in the product code frame.

The arrow 301a indicates the sequence order of a transmission area of the top OTUk frame and the arrow 301b indicates the sequence order of a redundancy area of the top OTUk frame. Similarly, the arrow 302a indicates the sequence order of the transmission area of the second OTUk frame and the arrow 302b indicates the sequence order of the redundancy area of the second OTUk frame. Meanwhile, a solid line of the arrows indicates a portion actually including transmission data and a chain line indicates a virtual line for indicating a connection of the sequence (the transmission data is not included on the chain line). Meanwhile, a part of the arrows 301a, 301b, 302a, and 302b is omitted in order to make the drawing more visible. Hereinafter, similar allocation is performed for a third OTUk frame and subsequent ones.

However, for each sequence of the latter OTUk frame, the allocation is performed by writing/reading using bit/byte enable of a RAM to/from a portion of an area 303 and the like.

Figure 11:
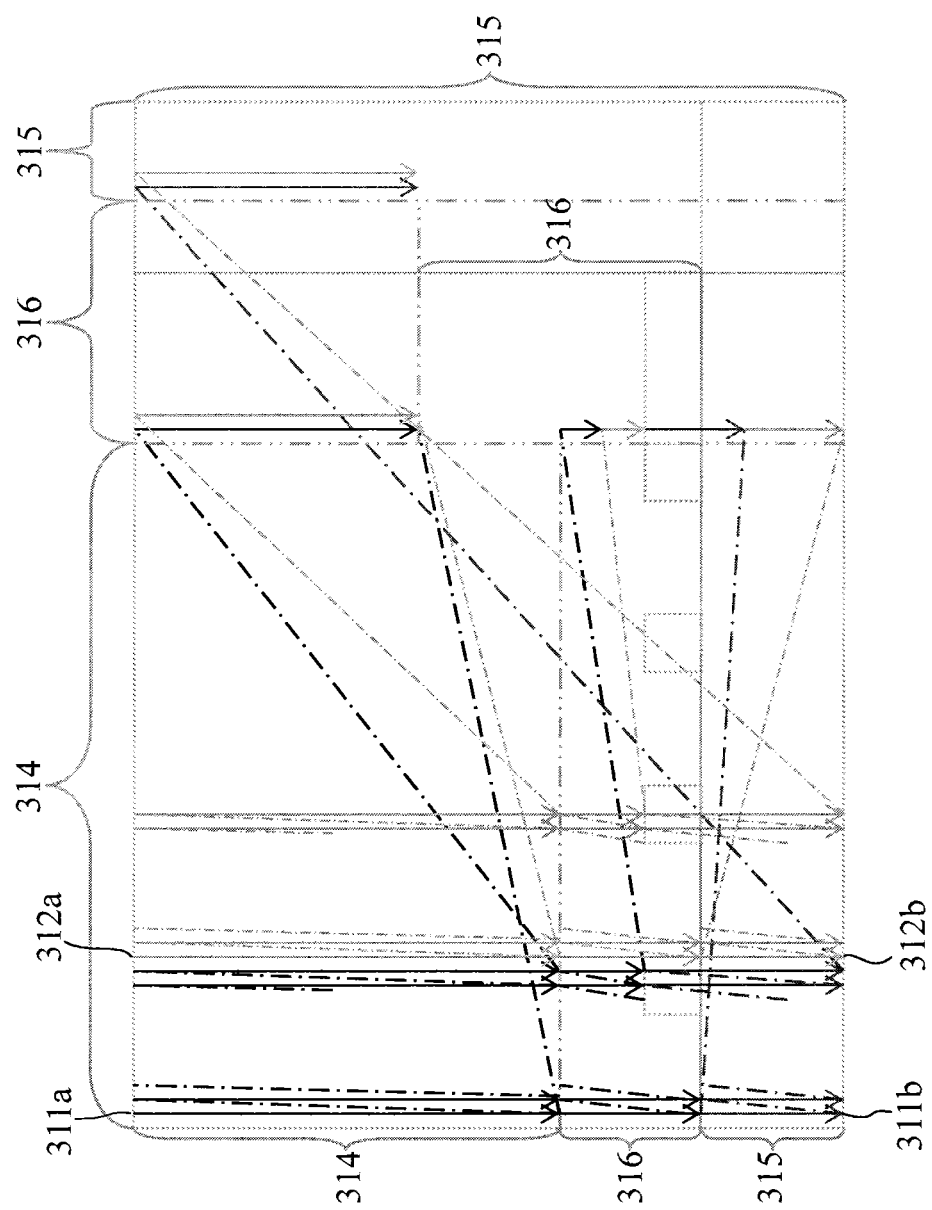
FIG. 11 is an illustrative diagram illustrating the frame format of the error correction coding method according to Embodiment 3.

FIG. 11 is an illustrative diagram illustrating another frame format of the product code of the digital transmission system according to the Embodiment 3 of the present invention. In FIG. 11, thick arrows 311a and 311b are the arrows indicating the sequence order of a Row1 of the top OTUk frame included in the product code frame and thin arrows 312a and 312b are the arrows indicating the sequence order of a Row2 of the top OTUk frame included in the product code frame.

The arrow 311a indicates the sequence order of the transmission area of the Row1 of the top OTUk frame and the arrow 311b indicates the sequence order of the redundancy area of the Row1 of the top OTUk frame. Similarly, the arrow 312a indicates the sequence order of the transmission area of the Row2 of the top OTUk frame and the arrow 312b indicates the sequence order of the redundancy area of the Row2 of the top OTUk frame. The solid line of the arrows indicates the portion actually including the transmission data and the chain line indicates the virtual line for indicating the connection of the sequence (the transmission data is not included on the chain line). A part of the arrows 311a, 311b, 312a, and 312b is omitted in order to make the drawing more visible. Hereinafter, similar allocation is performed for a Row3 of the top OTUk frames and subsequent ones.

An area 314 sectioned by a chain double-dashed line indicates the area to which the transmission area is uniformly allocated, an area 315 indicates the area to which the redundancy area is uniformly allocated, and an area 316 indicates the area to which the transmission area and the redundancy area are non-uniformly allocated.

In the product code frame in FIG. 11, for the sequence of the transmission area of the OTUk frame, as indicated by the arrows 311a and 312a, first, the allocation is uniformly performed in a longitudinal direction for a portion of the area 314 and non-uniformly performed in the longitudinal direction for a portion of the area 316. For the sequence of the redundancy area of the OTUk frame, as indicated by the arrows 311b and 312b, first, the allocation is non-uniformly performed in the longitudinal direction for the portion of the area 316 and uniformly performed in the longitudinal direction for a portion of the area 315. For the portions of the area 314 and the area 315, the allocation is performed in bit (or symbol) width with which a uniform process is easily performed according to a bus width of a parallel input data bus, a word length of a RAM and the like in the error correction encoder 12 or the error correction decoder 24. On the other hand, for the portion of the area 316, the allocation is performed by the writing/reading using the bit/byte enable of the RAM and the like.

Figure 12:
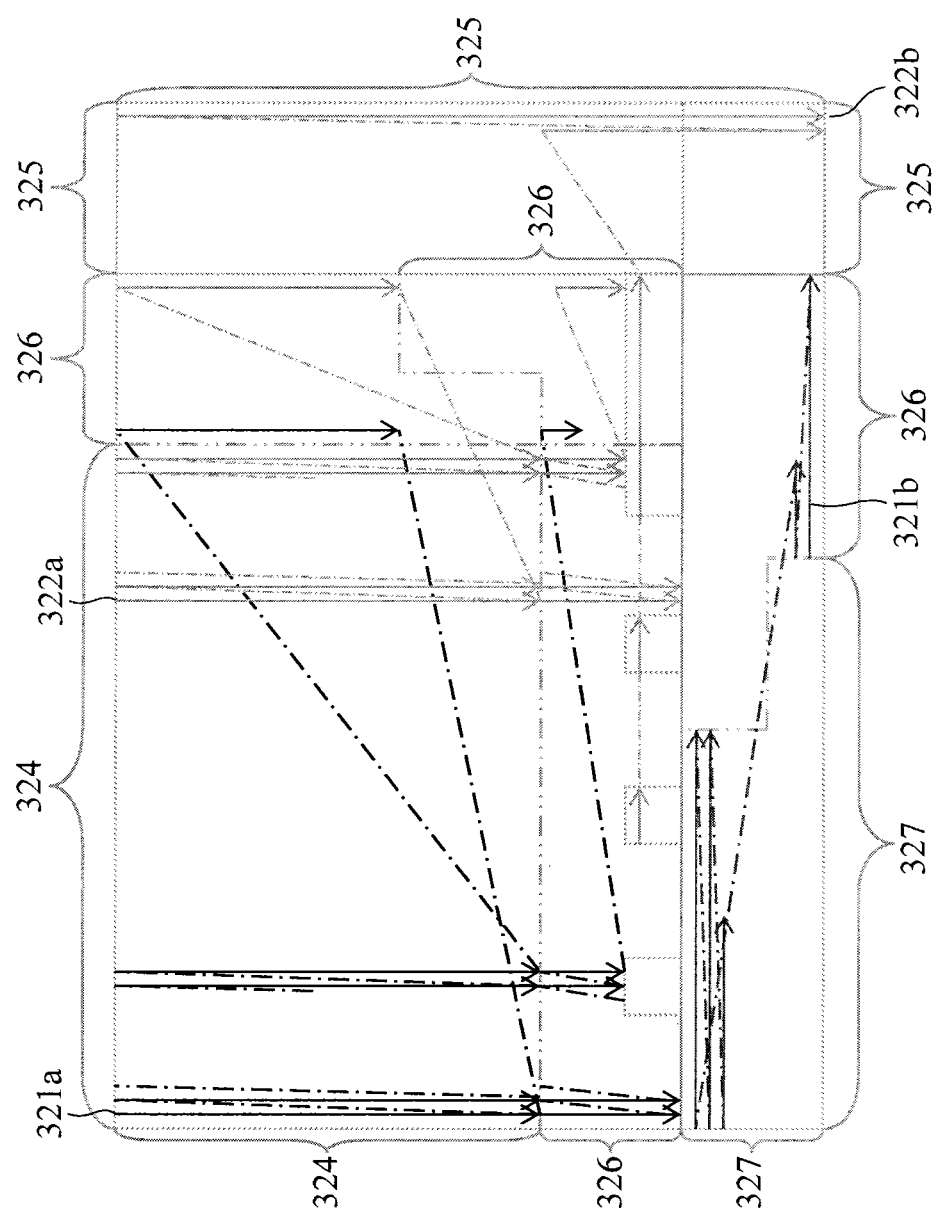
FIG. 12 is an illustrative diagram illustrating the frame format of the error correction coding method according to Embodiment 3.

FIG. 12 is an illustrative diagram illustrating another frame format of the product code of the digital transmission system according to the Embodiment 3 of the present invention. In FIG. 12, thick arrows 321a and 321b are the arrows indicating the sequence order of the Row1 of the top OTUk frame included in the product code frame and thin arrows 322a and 322b are the arrows indicating the sequence order of a Row4 of the last OTUk frame included in the product code frame.

The arrow 321a indicates the sequence order of the transmission area of the Row1 of the top OTUk frame and the arrow 321b indicates the sequence order of the redundancy area of the Row1 of the top OTUk frame. Similarly, the arrow 322a indicates the sequence order of the transmission area of the Row4 of the last OTUk frame and the arrow 322b indicates the sequence order of the redundancy area of the Row4 of the last OTUk frame. The solid line of the arrows indicates the portion actually including the transmission data and the chain line indicates the virtual line for indicating the connection of the sequence (the transmission data is not included on the chain line). Meanwhile, a part of the arrows 321a, 321b, 322a, and 322b is omitted in order to make the drawing more visible. Hereinafter, similar allocation is performed for each Row of all the OTUk frames not illustrated.

An area 324 sectioned by the chain double-dashed line indicates the area to which the transmission area is uniformly allocated, areas 325 and 327 indicate the areas to which the redundancy area is uniformly allocated, and an area 326 indicates the area to which the transmission area and the redundancy area are non-uniformly allocated.

In the product code frame in FIG. 12, for the sequence of the transmission area of the OTUk frame, as indicated by the arrows 321a and 322a, first, the allocation is uniformly performed in the longitudinal direction for a portion of the area 324 and non-uniformly performed in the longitudinal direction for a portion of the area 326. For the sequence of the redundancy area of the OTUk frame, as indicated by the arrows 321b and 322b, first, the allocation is non-uniformly performed in the lateral direction for the portion of the area 326, uniformly performed in the longitudinal direction for a portion of the area 325, and uniformly performed in the lateral direction for a portion of the area 327. For the portions of the area 324, the area 325, and the area 327, the allocation is performed in bit (or symbol) width with which the uniform process is easily performed according to the bus width of the parallel input data bus, the word length of the RAM and the like in the error correction encoder 12 or the error correction decoder 24. On the other hand, for the portion of the area 326, the allocation is performed by the writing/reading by using the bit/byte enable of the RAM and the like.

As described above, according to the Embodiment 3, it is configured such that the sequences of the same OTUk frame are arranged so as to be gathered as far as possible in the product code frame, so that the number of writing to the RAM for rearrangement may be reduced.

Embodiment 4

Figure 13:
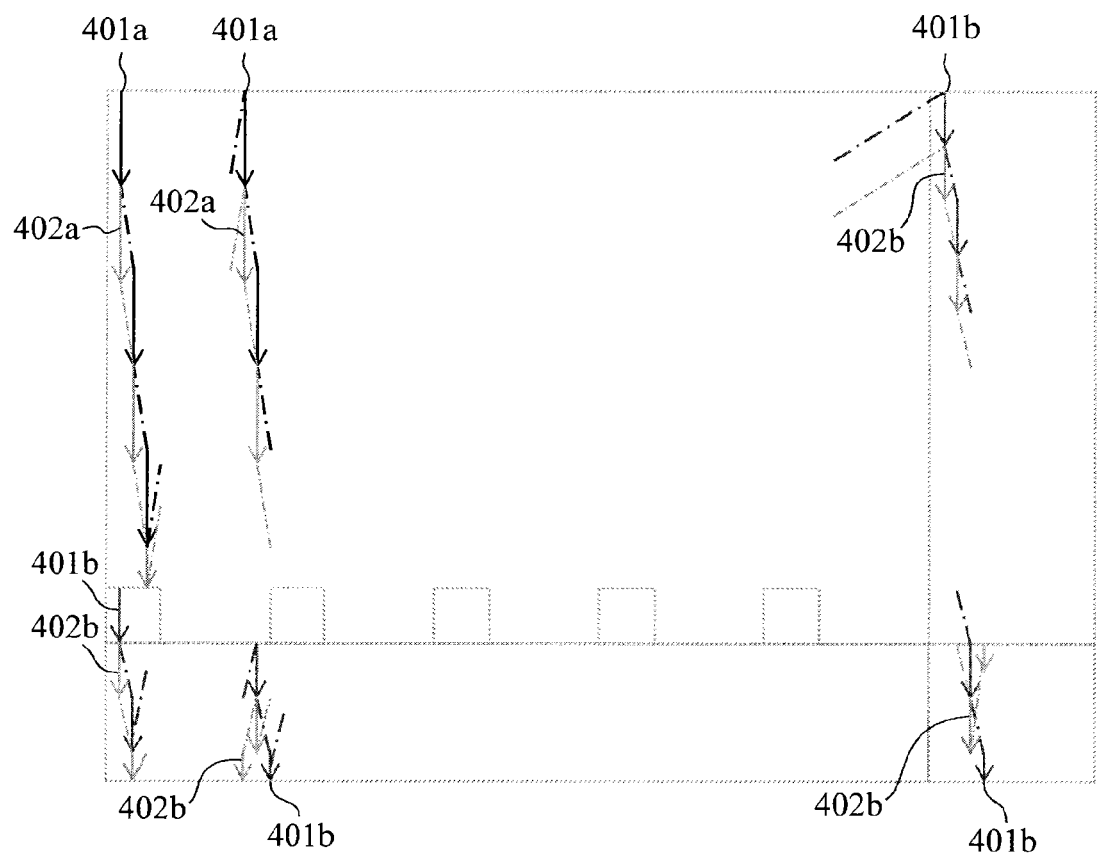
FIG. 13 is an illustrative diagram illustrating a frame format of an error correction coding method according to Embodiment 4.

FIG. 13 is an illustrative diagram illustrating a frame format of a product code of a digital transmission system according to Embodiment 4 of the present invention. In FIG. 13, arrows 401a and 401b are the arrows indicating sequence order of a top OTUk frame included in a product code frame and arrows 402a and 402b are the arrows indicating the sequence order of a second OTUk frame included in the product code frame.

The arrow 401a indicates the sequence order of a transmission area of the top OTUk frame and the arrow 401b indicates the sequence order of a redundancy area of the top OTUk frame. Similarly, the arrow 402a indicates the sequence order of the transmission area of the second OTUk frame and the arrow 402b indicates the sequence order of the redundancy area of the second OTUk frame. A solid line of the arrows indicates a portion actually including transmission data and a chain line indicates a virtual line for indicating a connection of the sequence (Note that the transmission data is not included on the chain line).

In FIG. 13, as indicated by the arrows 401a and 402a, the transmission areas of the OTUk frame are arranged at regular intervals and arranged so as to jump to another site at a regular rate. Similarly, as indicated by the arrows 401b and 402a, the redundancy areas of the OTUk frame are arranged at regular intervals and arranged so as to jump to another site at a regular rate. In a third OTUk frame and subsequent ones also, rearrangement is performed in a regular and dispersed manner similar to this. On the other hand, for each sequence of the latter OTUk frame, allocation is performed by writing/reading by using bit/byte enable of a RAM to/from a portion of an area not illustrated.

As described above, according the Embodiment 4, the sequences of the identical OUTk frame are arranged so as to be dispersed as far as possible in the product code frame, so that it is possible to improve burst error resilience.

In the invention of the present application, it is possible to freely combine each of the embodiments, modify an optional component of each of the embodiments, and omit an optional component in each of the embodiments without departing from the scope of the invention.

INDUSTRIAL APPLICABILITY

As described above, the error correction coding device, the error correction decoding device, and the method therefor according to the present invention may inhibit the waste of the transmission throughput and improve the error correction processing capability by non-uniformly allocating the information sequence area to the parity sequence are and/or non-uniformly allocating the parity sequence area to the information sequence area according to the excess or the deficiency generated in the allocation of the information sequence area and the parity sequence area in the product code frame, for example, so that the invention is suitable for being used in the digital transmission system and the like.

The invention claimed is:
1. An error correction coding device that performs error correction coding on data of an information source on a basis of a product code, the error correction coding device comprising:
    an error correction encoder that performs the error correction coding to generate a product code frame having an information sequence area and a parity sequence area, the information sequence area being transmitted by a transmission area of a transmission frame, the parity sequence area being transmitted by a redundancy area of the transmission frame,
    wherein
        when the parity sequence area of the product code is larger than the redundancy area of the transmission frame, the error correction encoder allocates a part of the parity sequence area to the information sequence area of the product code, and when the information sequence area of the product code frame is larger than the transmission area of the transmission frame, the error correction encoder allocates a part of the information sequence area to the parity sequence area of the product code frame.

2. The error correction coding device according to claim 1, wherein, when each element code of an outer code and/or an inner code being element codes in the product code frame satisfies a condition for a predetermined subcode, the error correction encoder performs the allocating of the part of the redundancy area and the part of the transmission area.

3. The error correction coding device according to claim 2, wherein the error correction encoder makes each element code of the outer code and/or the inner code a systematic code.

4. The error correction coding device according to claim 1, wherein the error correction encoder performs the allocating of the part of the redundancy area and the part of the transmission area in a dispersed manner.

5. An error correction decoding device that performs error correction decoding based on a product code of a product code frame having an information sequence area and a parity sequence area, the information sequence area being transmitted by a transmission area of a transmission frame, the parity sequence area being transmitted by a redundancy area of the transmission frame, the error correction decoding device comprising:

an error correction decoder that performs decoding on an outer code and an inner code of the product code frame, wherein the product code frame has been generated by allocating a part of the parity sequence area to the information sequence area, and/or allocating a part of the information sequence area to the parity sequence area, such that when the parity sequence area of the product code is larger than the redundancy area of the transmission frame, a part of the parity sequence area is allocated to the information sequence area of the product code, and when the information sequence area of the product code frame is larger than the transmission area of the transmission frame, a part of the information sequence area is allocated to the parity sequence area of the product code frame.

6. The error correction decoding device according to claim 5, wherein each element code of the outer code and the inner code satisfies a condition for a predetermined subcode.

7. The error correction decoding device according to claim 6, wherein each element code of the outer code and/or the inner code has been made a systematic code.

8. The error correction decoding device according to claim 5, wherein the part of the parity sequence area and the part of the information sequence area are allocated in a dispersed manner.

9. An error correction coding method of performing error correction coding on data of information source of a transmission frame on a basis of a product code, the error correction coding method comprising:

performing the error correction coding to generate a product code frame having an information sequence area and a parity sequence area, the information sequence area being transmitted by a transmission area of a transmission frame, the parity sequence area being transmitted by a redundancy area of the transmission frame, wherein the performing the error correction coding includes sub-steps of:

allocating, when the parity sequence area of the product code is larger than the redundancy area of the transmission frame, a part of the parity sequence area to the information sequence area of the product code; and allocating, when the information sequence area of the product code frame is larger than the transmission area of the transmission frame, a part of the information sequence area to the parity sequence area of the product code frame.

10. An error correction decoding method of performing error correction decoding based on a product code of a product code frame having an information sequence area and a parity sequence area, the information sequence area being transmitted by a transmission area of a transmission frame, the parity sequence area being transmitted by a redundancy area of the transmission frame, the error correction decoding method comprising:

performing decoding on an outer code and an inner code of the product code frame, wherein the product code frame has been generated by allocating a part of the parity sequence area to the information sequence area, and/or allocating a part of the information sequence area to the parity sequence area, such that when the parity sequence area of the product code is larger than the redundancy area of the transmission frame, a part of the parity sequence area is allocated to the information sequence area of the product code, and when the information sequence area of the product code frame is larger than the transmission area of the transmission frame, a part of the information sequence area is allocated to the parity sequence area of the product code frame.

11. The error correction coding device, according to claim 1, wherein the error correction encoder is configured to:

when the parity sequence area of the product code is smaller than the redundancy area of the transmission frame, the error correction encoder allocates a part of the information sequence area of the product code to the parity sequence area, and when the information sequence area of the product code frame is smaller than the transmission area of the transmission frame, the error correction encoder allocates a part of the parity sequence area of the product code frame to the information sequence area.

12. The error correction coding method according to claim 9, wherein the performing the error correction coding includes sub-steps of:

allocating, when the parity sequence area of the product code is smaller than the redundancy area of the transmission frame, a part of the information sequence area of the product code to the parity sequence area, and allocating, when the information sequence area of the product code frame is smaller than the transmission area of the transmission frame, a part of the parity sequence area of the product code to the information sequence area.

* * * * *